(12) United States Patent
Abe et al.

(10) Patent No.: US 6,846,190 B2
(45) Date of Patent: Jan. 25, 2005

(54) IC SOCKET AND GRIPPING SHEET USED IN THE SAME

(75) Inventors: Shintaro Abe, Chiba (JP); Ikuo Enomoto, Tokyo (JP); Yoshihisa Yamamoto, Tokyo (JP)

(73) Assignee: Tyco Electronics AMP K.K., Kanagawa (JP)

(*) Notice: Subject to any disclaimer, the term of this patent is extended or adjusted under 35 U.S.C. 154(b) by 0 days.

(21) Appl. No.: 10/134,226

(22) Filed: Apr. 25, 2002

(65) Prior Publication Data

US 2002/0160643 A1 Oct. 31, 2002

(30) Foreign Application Priority Data

Apr. 25, 2001 (JP) ........................................ 2001-127552

(51) Int. Cl.[7] .............................................. H01R 13/44
(52) U.S. Cl. ...................................... 439/135; 439/940
(58) Field of Search ............................ 439/342, 70, 71, 439/66, 259, 67, 940, 135

(56) References Cited

U.S. PATENT DOCUMENTS

| 4,068,369 | A | * | 1/1978 | Kaminski | 29/622 |
|---|---|---|---|---|---|
| 5,002,499 | A | * | 3/1991 | Matsuoka | 439/342 |
| 5,890,915 | A | * | 4/1999 | Reylek | 439/91 |
| 6,293,808 | B1 | * | 9/2001 | Ochiai | 439/70 |
| 6,402,537 | B2 | * | 6/2002 | Ikeya | 439/259 |
| 6,504,104 | B2 | * | 1/2003 | Hacke et al. | 174/254 |
| 6,530,798 | B1 | * | 3/2003 | Li et al. | 439/342 |
| 6,554,625 | B1 | * | 4/2003 | Liao et al. | 439/135 |
| 6,558,174 | B1 | * | 5/2003 | Hou | 439/135 |

FOREIGN PATENT DOCUMENTS

| JP | 1994-31079 | 4/1994 | H01R/9/09 |
|---|---|---|---|
| JP | 3006449 | 11/1994 | H01R/43/20 |

* cited by examiner

Primary Examiner—Gary Paumen
Assistant Examiner—Edwin A. Leon
(74) Attorney, Agent, or Firm—Barley, Snyder, Senft & Cohen, LLC

(57) ABSTRACT

Provided is a surface-mounted IC socket having a base housing and a gripping sheet. The base housing has a top surface and contacts. A slider moves over the top surface of the base housing and has an upper surface with a plurality of pin contact receiving holes arranged in the form of a matrix that receives pin contacts formed on an IC package that contact the contacts. Projecting parts having outer edges protrude from the upper surface. The gripping sheet has cuts corresponding to the projecting parts and is pasted on the upper surface such that the cuts correspond to the projecting parts.

18 Claims, 6 Drawing Sheets

IC SOCKET AND GRIPPING SHEET USED IN THE SAME

BACKGROUND OF THE INVENTION

The present invention relates to a surface-mounted connector containing an integrated circuit (IC) socket. More particularly, the invention relates to a surface-mounted connector containing an IC socket that has a gripping sheet and is used to connect a pin grid array (PGA) IC package having pin contacts arranged in the form of a matrix to a circuit board.

DESCRIPTION OF THE PRIOR ART

In surface-mounted connectors containing integrated circuit (IC) sockets, a gripping sheet is pasted to an upper surface of the connector before the connector is soldered to a circuit board. The gripping sheet has a gripping surface for a nozzle of a surface-mounting device, such as a chip mounter, that automatically places the connector on the surface of the circuit board.

Two known examples of surface-mounted connectors equipped with gripping sheets are shown in Japanese Utility Model Application Kokai No. H6-31079 and Japanese Registered Utility Model No. 3006449 and are illustrated in FIGS. 7 and 8, respectively.

Shown in FIG. 7, the surface-mounted connector 101 comprises a rectangular insulating housing 110 having a receiving recess 111 for a mating connector (not shown) in the central region of the housing 110. A plurality of SMT terminals 120 are attached at a specified pitch along the length of the housing 110 and are connected to a circuit board (not shown) by soldering. A gripping sheet 130, which possesses heat resistance and acts as a gripping surface for a nozzle of a chip mounter, is pasted to an upper surface of the housing 110. The gripping sheet 130 has the same area as the area that demarcates the four sides of the housing 110 and is pasted to the upper surface of the housing 110 so that outside edges on the four sides of the gripping sheet 130 coincide with the outside edges on the four sides of the housing 110.

Shown in FIG. 8, the surface-mounted connector 201 comprises a rectangular insulating housing 210 having two rows of contact accommodating passages 211 formed along the length of the housing 210. A plurality of contacts 220 are accommodated in the contact accommodating passages 211 and are connected to a circuit board (not shown) by soldering. A gripping sheet 230, which engages a vacuum suction nozzle, is pasted to an upper surface of the housing 210.

In both of the surface-mounted connectors 101, 201 shown in FIGS. 7 and 8, the upper surface of the housing 110, 210 is flat. Accordingly, the gripping sheet 130, 230 is maintained in a flat state, so that a surface-mounting device, such as a chip mounter, can reliably perform.

However, in cases where the surface-mounted connectors 101, 201 are applied to IC sockets, there are instances in which projecting parts acting as IC standoffs are formed on the upper surfaces of the housings 110, 210. The projecting parts protrude further upward than the upper surfaces of the housings 110, 210 causing wrinkles in the gripping surfaces of the gripping sheets 130, 230 that are pasted to the upper surfaces of the housings 110, 210. If wrinkles are generated in the gripping surfaces of the gripping sheets 130, 230, surface mounting cannot be reliably performed. Gaps can also form between the gripping sheets 130, 230 and the upper surfaces of the housings 110, 210. If gaps are generated, dust may easily enter the accommodating recesses 111 and the contact accommodating passages 211 of the housings 110, 210.

It is therefore desirable to develop a surface-mounted IC socket and a gripping sheet that can accommodate a projecting part formed on the upper surface of the connector such that when the gripping sheet is pasted to the connector having the projecting part, the generation of wrinkles in the gripping sheet and the generation of gaps between the upper surface of the connector and the gripping sheet is prevented.

SUMMARY OF THE INVENTION

The invention relates to an IC socket having a housing and a gripping sheet. The housing has an upper surface with a plurality of pin contact receiving holes arranged in the form of a matrix that receive pin contacts formed on an IC package. Projecting parts protrude from the upper surface of the housing. The gripping sheet has cuts corresponding to the projecting parts and is pasted on the upper surface such that the cuts correspond to the projecting parts.

BRIEF DESCRIPTION OF THE DRAWINGS

FIG. 6 (B) is a partial sectional view along line 6B—6B in FIG. 6 (A).

DETAILED DESCRIPTION OF THE PREFERRED EMBODIMENT

Figure 1:
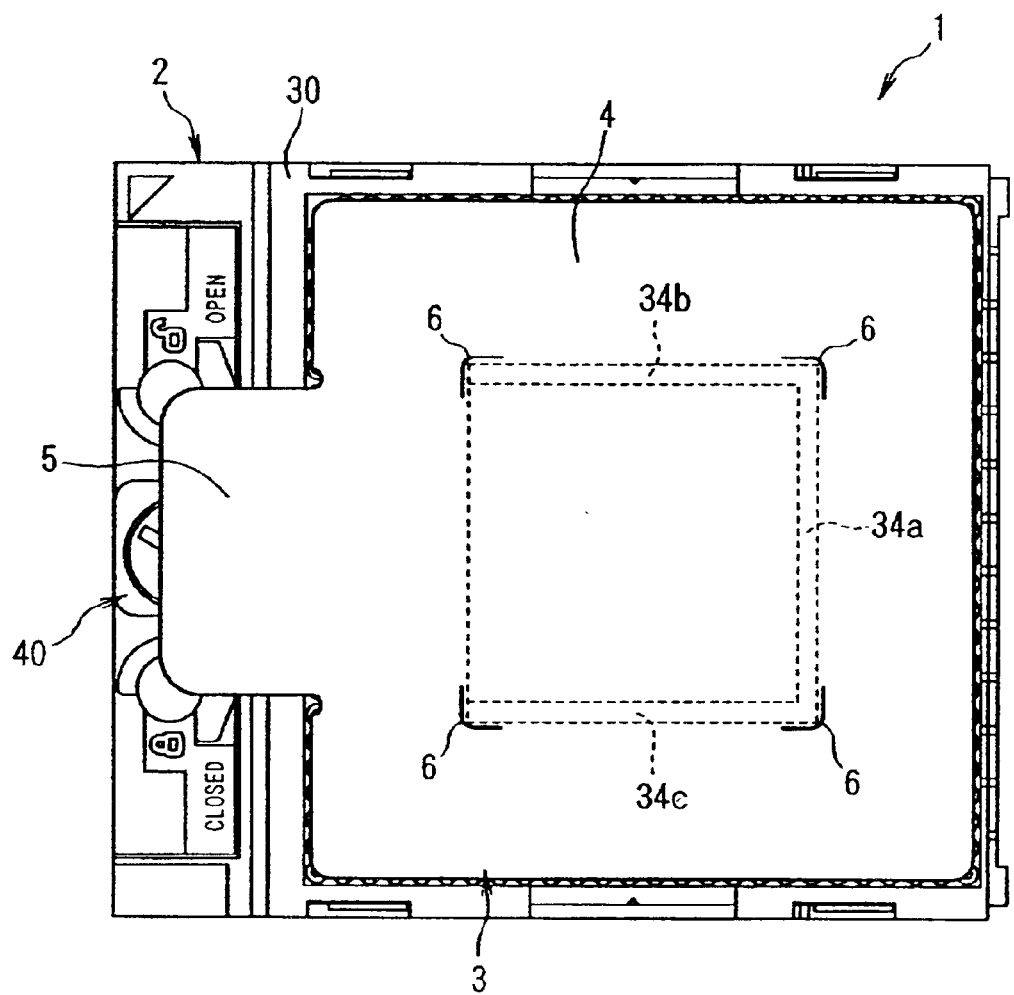
FIG. 1 is a plan view of an embodiment of the IC socket of the present invention showing the slider in an open position.

The IC socket 1, shown in FIG. 1, is used to connect numerous pin contacts formed on a pin grid array (PGA) integrated circuit (IC) package to a circuit board (not shown). The IC socket 1 is constructed from a connector part 2 and a gripping sheet 3 that is pasted to an upper surface of the connector part 2.

Figure 4:
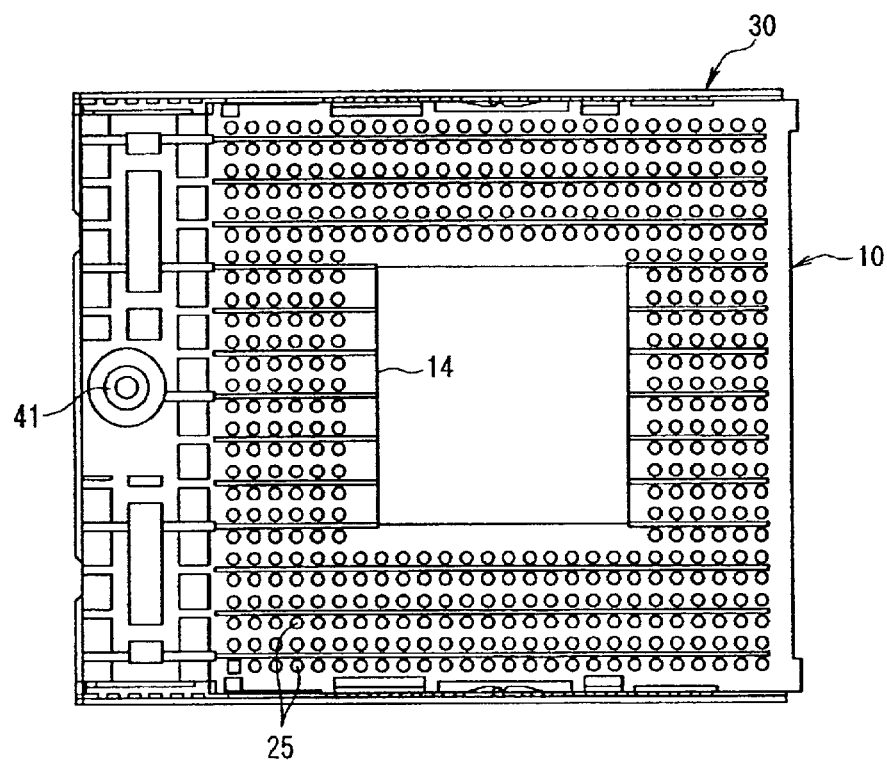
FIG. 4 is a bottom view of the connector part in which the slider is in the open position.
Figure 5:
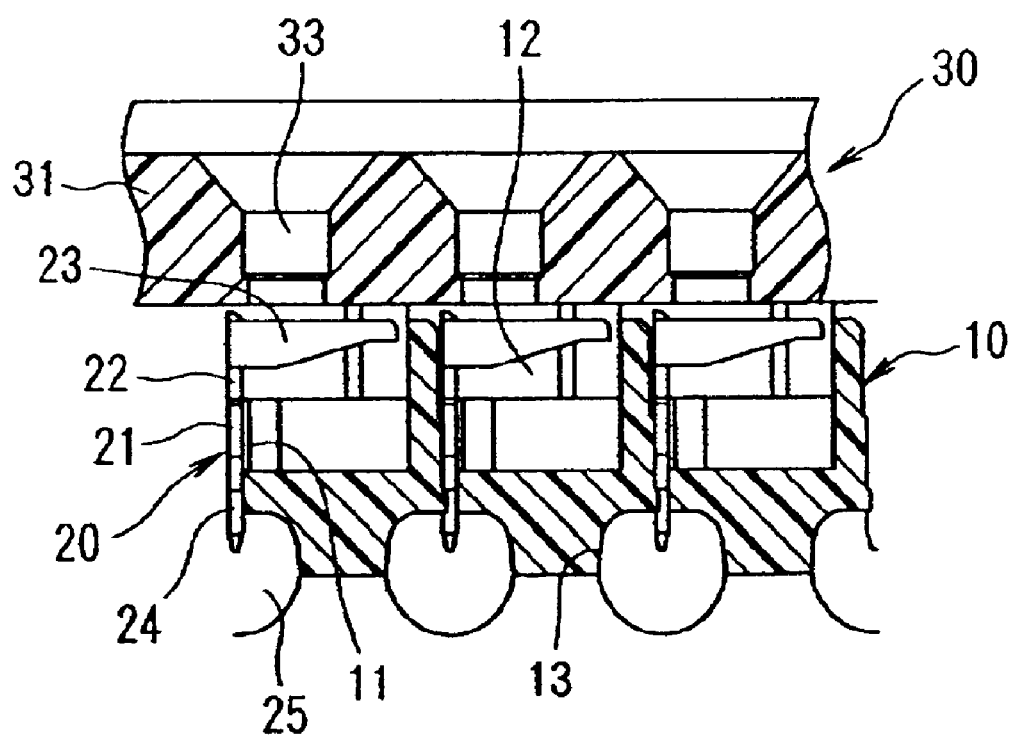
FIG. 5 is a partial sectional view along line 5—5 in FIG. 2(A).

Shown in FIGS. 2 through 5, the connector part 2 has a substantially rectangular insulating base housing 10. A plurality of contacts 20, shown in FIG. 5, are disposed in the base housing 10 in the form of a matrix and are connected to the circuit board (not shown) via solder balls 25. A slider 30 slides over the upper surface of the base housing 10 in the left-right direction (i.e., the left-right direction in FIGS. 2(A) and 2(B)). The slider 30 can move between an open position shown in FIG. 2(A) and a closed position shown in FIG. 2 (B).

Figure 2:
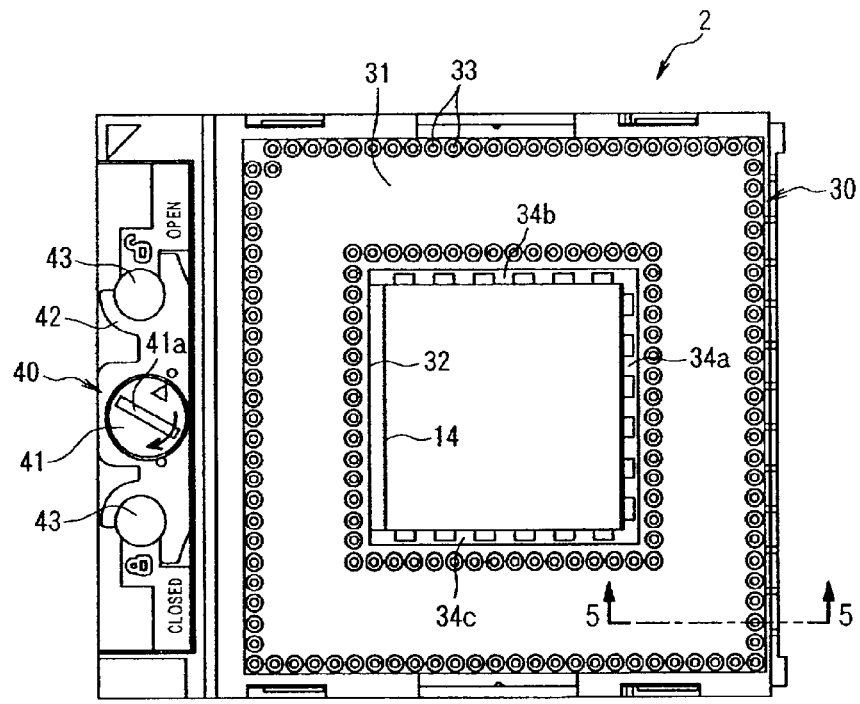
FIG. 2(A) shows a plan view of the connector part in which the gripping sheet has been removed from the IC socket shown in FIG. 1 when the slider is in the open position.
FIG. 2(B) shows a plan view of the connector part in which the gripping sheet has been removed from the IC socket shown in FIG. 1 when the slider is in a closed position.
Figure 2:
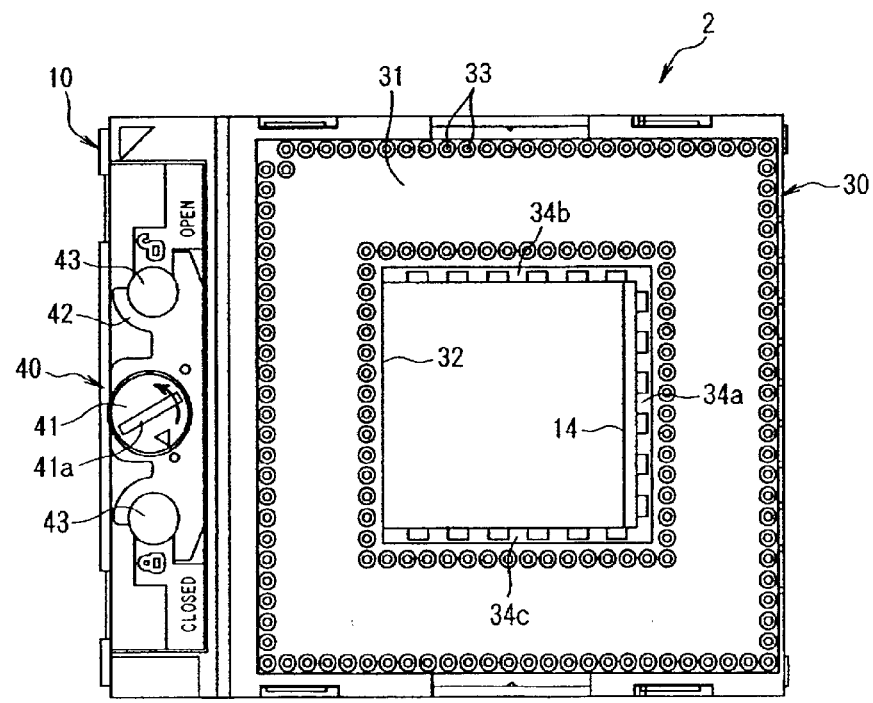
Figure 3:
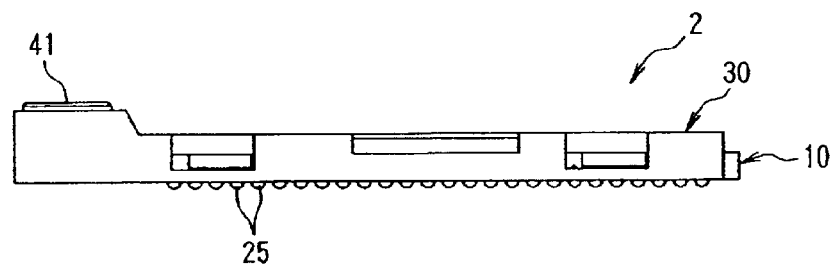
FIG. 3 is a front view of the connector part in which the slider is in the open position.

The base housing 10 is formed by molding a thermoplastic resin such as a liquid crystal polymer with a plurality of contact press-fitting holes 11, as shown in FIG. 5. The press-fitting holes 11 hold the contacts 20 by press-fitting and are disposed in the form of a matrix around the periphery of a rectangular opening 14, as shown in FIGS. 2 and 4. As shown in FIG. 5, contact part accommodating spaces 12, which accommodate the contact parts 23 of the contacts 20, are disposed above the respective contact press-fitting holes 11. Solder ball accommodating holes 13 are disposed beneath the contact press-fitting holes 11.

Shown in FIG. 5, each of the contacts 20 comprises a press-fitting plate part 21 which is press-fitted in the corresponding contact press-fitting hole 11 of the base housing 10. A base plate part 22 extends upward from the press-fitting plate part 21 and is positioned inside the corresponding contact part accommodating space 12. A pair of contact parts 23 extends through the contact part accommodating space 12 from both edges of the base plate part 22. A solder ball connecting part 24 extends downward from the press-fitting plate part 21 and is positioned inside the corresponding solder ball accommodating hole 13. Each of the contacts 20 is formed by stamping and forming a metal plate. The width between the pair of contact parts 23 becomes gradually narrower from the side of the base plate part 22 toward the tip end of the contact 20.

Shown in FIG. 2, the slider 30 has a main body 31 having a plurality of pin contact receiving holes 33 (some of the pin contact receiving holes 33 are omitted) disposed in the form of a matrix that receive a plurality of PGA type IC package pin contacts (not shown). The main body 31 is carried on the base housing 10 so that the main body 31 can move in the left-right direction between the open position shown in FIG. 2(A) and the closed position shown in FIG. 2(B). A rectangular opening 32 is formed in a central region of the main body 31. Projecting parts 34a, 34b, 34c protrude upward from the upper surface of the main body 31 and are disposed around three sides of the rectangular opening 32. A slider moving mechanism 40, used to move the main body 31 in the left-right direction, is disposed on the left end portion of the main body 31.

The slider moving mechanism 40 is equipped with an eccentric cam 41 having a pivoting shaft part (not shown) that can pivot relative to the base housing 10 and an eccentric cam part (not shown) that is offset in an eccentric position with respect to the pivoting shaft part and causes the main body 31 of the slider 30 to move in the left-right direction when the pivoting shaft part pivots. A tool insertion hole 41a, for a tool such as a flat-head screwdriver, is formed in the head part of the eccentric cam 41. A metal plate 42 is supported at both ends by attachment shaft parts 43 and is disposed between the head part of the eccentric cam 41 and the upper surface of the main body 31 of the slider 30. The metal plate 42 has the function of transmitting force from the eccentric cam 41 to the slider 30 when the eccentric cam 41 is pivoted so that the slider 30 is caused to move. When the eccentric cam 41 is positioned in a first position, shown in FIG. 2(A), the slider 30 is positioned in the open position. When the eccentric cam 41 is rotated in the direction indicated by the arrow shown in FIG. 2(A), the eccentric cam 41 moves from the first position to the second position, shown in FIG. 2(B), positioning the slider 30 in the closed position.

Figure 6:
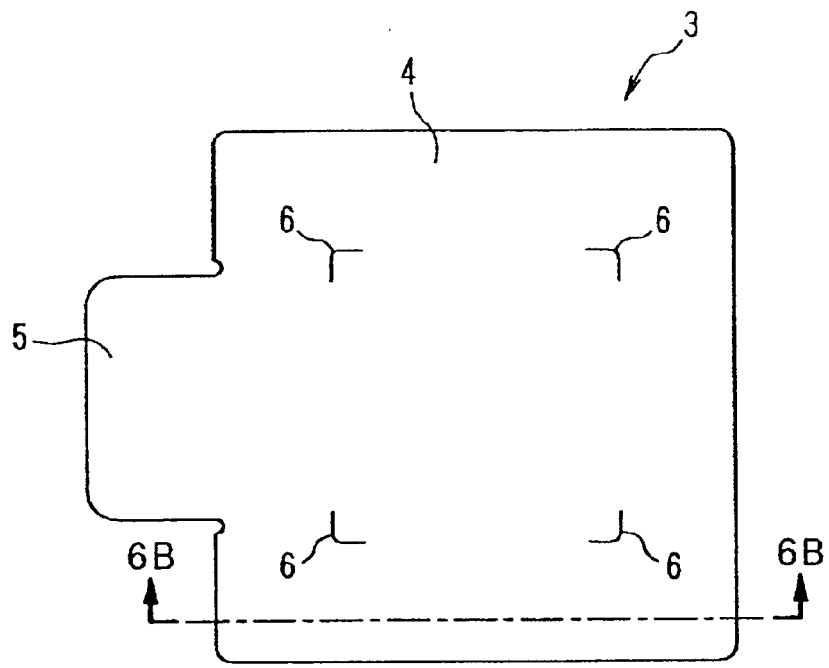
FIG. 6 (A) is a plan view of the gripping sheet.
Figure 6:
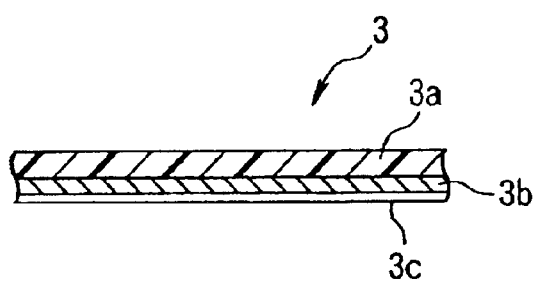
Figure 7:
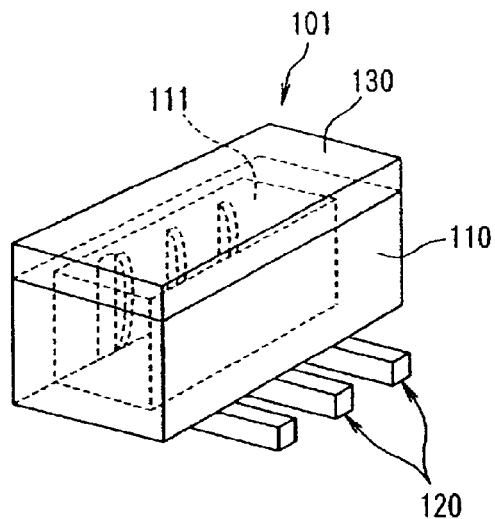
FIG. 7 is a perspective view of a first example of a surface-mounted connector of the prior art.
Figure 8:
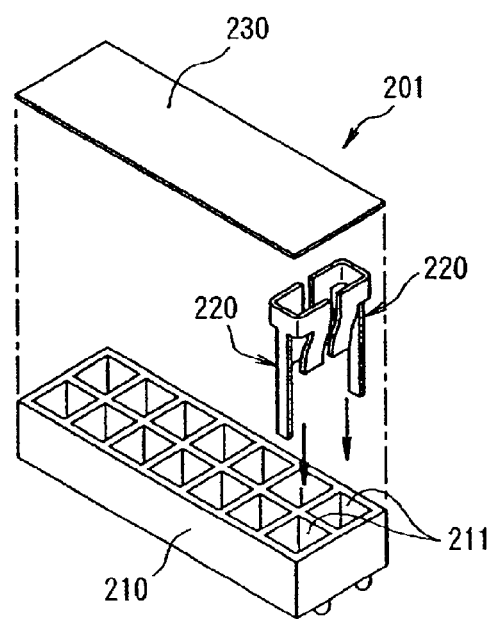
FIG. 8 is an exploded perspective view of a second example of a surface-mounted connector of the prior art.

As shown most clearly in FIG. 6(A), the gripping sheet 3 has a substantially rectangular planar main body 4 and an ear part 5 that protrudes from the planar main body 4. Four cuts 6 are formed in the planar main body 4 of the gripping sheet 3 in positions corresponding to the outside edges of the four corner parts of the projecting parts 34a, 34b, 34c that protrude from the upper surface of the slider 30. Shown in FIG. 6(B), the gripping sheet 3 is formed by coating the undersurface of a heat-resistant polyamide film 3a with an adhesive agent 3b. At the time of manufacture, the gripping sheet 3 is pasted to the surface of a separator 3c, however, the construction is arranged so that the gripping sheet 3 is peeled from the separator 3c when the gripping sheet 3 is pasted to the surface of the connector part 2.

After the connector part 2 has been manufactured, the gripping sheet 3 is pasted to the surface of the slider 30 of the connector part 2 before the connector part 2 is mounted on the circuit board. As shown in FIG. 1, when the gripping sheet 3 is pasted to the slider 30, the four cuts 6 are respectively positioned in positions corresponding to the outside edges of the four corner parts of the projecting parts 34a, 34b, 34c that protrude from the upper surface of the slider 30, and the ear part 5 is positioned above the eccentric cam 41.

If the four cuts 6 are respectively positioned in positions corresponding to the outside edges of the four corner parts of the projecting parts 34a, 34b, 34c at the time of the pasting, the four cuts 6 allow the escape of the projecting parts 34a, 34b, 34c, to prevent wrinkles from generating in the gripping surface surrounded by the four cuts 6 as a result of the projecting parts 34a, 34b, 34c. Furthermore, the region of the gripping sheet 3 where the pin contact receiving boles 33 are disposed also remains free of wrinkles and no gaps are generated between the upper surface of the slider 30 and the gripping sheet 3. As a result, surface mounting using the nozzle of a surface-mounting device, such as a chip mounter, can be reliably performed. Furthermore, since no gaps are generated between the upper surface of the slider 30 and the gripping sheet 3, the entry of dust into the pin contact receiving holes 33 can be prevented.

After the connector part 2 has been surface mounted by the nozzle that grips the gripping surface of the gripping sheet 3 so that the connector part 2 is automatically placed on the circuit board, the connector part 2 is connected to the circuit board by heating and fusing (all at one time) the solder balls 25 formed on the undersurface of the base housing 10. Afterward, the gripping sheet 3 is peeled from the connector part 2.

Next, when the main body 31 of the slider 30 is in the open position, shown in FIG. 2(A), the plurality of pin contacts of the IC package are inserted into the pin contact receiving holes 33. In this case, the pin contacts are positioned between the contact parts 23 on the side of the base plate parts 22 of the contacts 20. Since the width between the contact parts 23 is large, the pin contacts do not contact any part of the contacts 20. Accordingly, mounting of the IC package using so-called zero insertion force (ZIF) is possible. When the slider 30 is in the open position, the eccentric cam 41 is positioned in the first position.

Afterward, a tool (not shown), such as a flat-head screwdriver, is inserted into the tool insertion hole 41a formed in the head part of the eccentric cam 41. The eccentric cam 41 is rotated in the direction indicated by the arrow in FIG. 2(A), so that the slider 30 is caused to move to the right. As a result, the eccentric cam 41 is positioned in the second position, and the slider 30 is positioned in the closed position, as shown in FIG. 2(B). Consequently, the respective pin contacts move to the right in FIG. 5 (toward the tip ends of the contact parts 23 of the contacts 20) and contact the contact parts of the contacts 20, so that the pin contacts are electrically connected to the circuit board.

In order to release the contact state between the numerous pin contacts formed on the PGA type IC package and the contacts 20 of the connector, a tool, such as a flat-head screwdriver, is inserted into the tool insertion hole 41a formed in the head part of the eccentric cam 41, as shown in FIG. 2(B). The eccentric cam 41 is rotated in the direction indicated by the arrow in FIG. 2(B), so that the slider 30 is caused to move to the left. As a result, the eccentric cam 41 is positioned in the first position, and the slider 30 is positioned in the open position, as shown in FIG. 2(A). Consequently, the respective pin contacts move to the left in FIG. 5 (i.e., toward the base plate parts 22 of the contact parts 23 of the contacts 20), so that the contact state with respect to the contact parts 23 of the contacts 20 is released.

A working embodiment of the present invention has been described herein. However, the present invention is not limited to this working embodiment. Many other embodiments, are possible within the scope and spirit of the invention. For example, the pin contact receiving holes 33 may be formed not only in the slider 30 that can slide over the upper surface of the base housing 10, but also in the base housing 10 in the case of an IC socket that has no slider. Furthermore, it is not absolutely necessary that the projecting parts 34a, 34b, 34c are disposed around three sides of the rectangular opening 32. It is sufficient if the projecting parts 34a, 34b, 34c are merely disposed in the central region of the upper surface of the slider 30 or base housing 10.

We claim:

1. An IC socket comprising:
    a housing having an upper surface with a plurality of pin contact receiving holes arranged in the form of a matrix that receive pin contacts formed on an IC package;
    projecting parts that have outer edges and protrude from the upper surface; and
    a gripping sheet having cuts corresponding to the projecting parts that is pasted on the upper surface such that the gripping sheet substantially covers the pin contact receiving holes and the cuts correspond to the projecting parts.

2. The IC socket of claim 1, wherein the cuts in the gripping sheet are formed in positions corresponding to outer edges of the projecting parts.

3. The IC socket of claim 1, wherein the gripping sheet includes a first side having an adhesive agent and a second side formed for receiving a surface mounting device, the adhesive agent being such that the gripping sheet is detachable from the upper surface after surface mounting the housing.

4. The IC socket of claim 1, wherein the upper surface has a substantially centrally located rectangular opening and the projecting parts are disposed around a periphery of the rectangular opening.

5. The IC socket of claim 4, wherein the cuts in the gripping sheet are formed in positions corresponding to outer edges of the projecting parts.

6. An IC socket comprising:
    a base housing having a top surface and contacts;
    a slider that moves over the top surface of the base housing and has an upper surface with a plurality of pin contact receiving holes arranged in the form of a matrix that receive pin contacts formed on an IC package that contact the contacts;
    projecting parts that have outer edges and protrude from the upper surface; and
    a gripping sheet having cuts corresponding to the projecting parts that is pasted on the upper surface such that the cuts correspond to the projecting parts.

7. The IC socket of claim 6, wherein the cuts in the gripping sheet are formed in positions corresponding to outer edges of the projecting parts.

8. The IC socket of claim 6, wherein the base housing is formed by molding a thermoplastic resin with a plurality of press-fitting holes.

9. The IC socket of claim 6, wherein the gripping sheet includes a first side having an adhesive agent and a second side formed for receiving a surface mounting device, the adhesive agent being such that the gripping sheet is detachable from the upper surface after surface mounting the base housing.

10. The IC socket of claim 6, wherein the upper surface has a substantially centrally located rectangular opening and the projecting parts are disposed around a periphery of the rectangular opening.

11. The IC socket of claim 10, wherein the cuts in the gripping sheet are formed in positions corresponding to outer edges of the projecting parts.

12. The IC socket of claim 6, wherein the slider has a slider moving mechanism that moves the slider between an open and a closed position.

13. The IC socket of claim 12, wherein the gripping sheet has an ear part that is positioned adjacent to the slider moving mechanism.

14. A gripping sheet comprising:
    a substantially rectangular body dimensioned to substantially cover pin contact receiving holes formed in an IC socket and having an ear part and cuts formed in the body that correspond to outer edges of projecting parts on an upper surface of the IC socket, the body having an undersurface coated with an adhesive agent.

15. The gripping sheet of claim 14, wherein the body is a heat resistant polyamide film.

16. The gripping sheet of claim 15, wherein the underface of the body is pasted to the surface of a separator.

17. The gripping sheet of claim 15, wherein the adhesive agent is such that the body can be attached to the upper surface of the IC socket during assembly and detached from the IC socket after assembly.

18. The gripping sheet of claim 14, wherein the cuts are configured for receiving the outer edges such that the outer edges project therethrough.

* * * * *